(12) United States Patent
Uhlig et al.

(10) Patent No.: US 7,710,018 B2
(45) Date of Patent: May 4, 2010

(54) SUBSTRATE FOR LIGHT-EMITTING ELEMENT, METHOD FOR MANUFACTURING THE SAME, ELECTRODE FOR LIGHT-EMITTING ELEMENT, AND LIGHT-EMITTING ELEMENT HAVING THE SAME

(75) Inventors: Albrecht Uhlig, Berlin (DE); Kerstin Nolte, Berlin (DE)

(73) Assignee: Samsung Mobile Display Co., Ltd., Yongin (KR)

( * ) Notice: Subject to any disclaimer, the term of this patent is extended or adjusted under 35 U.S.C. 154(b) by 618 days.

(21) Appl. No.: 11/229,491

(22) Filed: Sep. 20, 2005

(65) Prior Publication Data
US 2006/0061270 A1 Mar. 23, 2006

(30) Foreign Application Priority Data
Sep. 21, 2004 (EP) .................................. 04090368
Mar. 7, 2005 (KR) ...................... 10-2005-0018757

(51) Int. Cl.
*H01J 1/62* (2006.01)
*H01J 63/04* (2006.01)

(52) U.S. Cl. ....................... 313/504; 313/498; 313/506; 313/512

(58) Field of Classification Search .......... 313/498–512
See application file for complete search history.

(56) References Cited

U.S. PATENT DOCUMENTS

| | | | |
|---|---|---|---|
| 6,372,154 B1 | 4/2002 | Li | |
| 6,771,018 B2 * | 8/2004 | Toguchi et al. | 313/498 |
| 2002/0079831 A1 | 6/2002 | He et al. | |
| 2003/0030370 A1 * | 2/2003 | Tada | 313/504 |
| 2003/0137239 A1 * | 7/2003 | Matsuura et al. | 313/503 |
| 2003/0146693 A1 * | 8/2003 | Ishihara et al. | 313/504 |
| 2003/0189403 A1 * | 10/2003 | Yamada et al. | 313/511 |
| 2004/0119406 A1 * | 6/2004 | Kobayashi | 313/506 |
| 2004/0126616 A1 * | 7/2004 | Iwasaki et al. | 428/690 |
| 2004/0140766 A1 * | 7/2004 | Nilsson et al. | 313/512 |

(Continued)

FOREIGN PATENT DOCUMENTS

CN 1165565 11/1997

(Continued)

OTHER PUBLICATIONS

Sawyer B. Fuller, Eric J. Wilhelm, and Joseph M. Jacobson; Ink-Jet Printed Nanoparticle Microelectromechanical Systems (Journal of Microelectromechanical Systems. vol. 11. No. 1. Feb. 2002—7 pages).

(Continued)

*Primary Examiner*—Joseph L Williams
*Assistant Examiner*—Kevin Quarterman
(74) *Attorney, Agent, or Firm*—H.C. Park & Associates, PLC

(57) ABSTRACT

A substrate for a light-emitting element based on an organic light-emitting material and a method of manufacturing the same are provided. The substrate can be manufactured at low cost and has long lifespan, and an organic material used on the substrate and has high electrical conductivity. The substrate for a light-emitting element includes a base substrate with metal layer formed on the base substrate and a conductive polymer layer disposed on the metal layer.

12 Claims, 3 Drawing Sheets

U.S. PATENT DOCUMENTS

2004/0160154 A1* 8/2004 Nishimura et al. .......... 313/113

FOREIGN PATENT DOCUMENTS

| CN | 1345469 | 4/2002 |
|---|---|---|
| JP | 2002-124391 | 4/2002 |
| WO | WO 03/001490 A2 | 1/2003 |
| WO | WO 2004/019666 A1 | 3/2004 |

OTHER PUBLICATIONS

K.F. Teng and Robert W. Vest; Metallization of Solar Cells with Ink Jet Printing and Silver Metallo-Organic Inks (IEEE Transactions of Components, Hybrids & Manufacturing Technology. vol. 11 No. 3. Sep. 1988, New York, NY, USA—7 pages).

Chinese Office Action dated Sep. 5, 2008.

Chinese Office Action mailed Mar. 13, 2009.

* cited by examiner

SUBSTRATE FOR LIGHT-EMITTING ELEMENT, METHOD FOR MANUFACTURING THE SAME, ELECTRODE FOR LIGHT-EMITTING ELEMENT, AND LIGHT-EMITTING ELEMENT HAVING THE SAME

CROSS REFERENCE TO RELATED APPLICATIONS

This application claims priority to and the benefit of European Patent Application No. 04 090 368.4, filed on Sep. 21, 2004 and Korean Patent Application No. 10-2005-0018757, filed on Mar. 7, 2005, in the Korean Intellectual Property Office, the disclosures of which are incorporated herein in their entirety by reference.

BACKGROUND OF THE INVENTION

1. Field of the Invention

The invention relates to a substrate for a light-emitting element based on an organic light-emitting material, a method of manufacturing the same, an electrode for a light-emitting element, and a light-emitting element having the same.

2. Description of the Background

A transparent substrate is generally used as an electrode in an organic light emitting diode (OLED) display or in a light-emitting element. In an OLED display, a layer formed of indium tin oxide (ITO) that is disposed on a base substrate is generally used as an anode.

In order to operate efficiently, OLED elements may have a variety of properties such as electron conductivity, hole conductivity, and light emission, but most materials that are used for an OLED satisfy only one of these properties. Multilayered elements in which different layers are combined may be used to increase efficiency. For example, one layer may have excellent hole conductivity and another layer may have a better electron conductivity.

In OLED applications, a hole injection layer (HIL) may be used on an ITO layer to increase the efficiency of an anode comprising a base substrate and an ITO layer. Polyethylene dioxythiophene/polystyrene sulfonate (PEDT/PSS) may be used as an HIL. One problem with this HIL is that the surface of the ITO layer becomes etched due to the acidity of the PEDT/PSS and ion diffusion and penetration to an organic layer of an OLED cannot be completely avoided. The ions adversely affect the durable lifespan of the OLED elements (Nucl. Inst. and Meth. In Physics Res. B194 (2002) 346; Appl. Phys. Lett. 75 (1999) 1404; Appl. Phys. Lett. 81/6 (2002) 1119; Mat. Sci. Engin. B97 (2003) 1-4; J. Appl. Phys. 79 (1996) 2745).

In order to maintain the same efficiency and increase the durable lifespan, it is desirable to use a substrate that has an electrode material other than ITO that is more resistant to PEDT/PSS. The electrode material is preferably inexpensive, translucent, and has high electric conductivity. In addition, the electrode material may be flexible so that it can be applied to flexible elements such as organic display elements or organic solar cells.

Polyethylene dioxythiophene (PEDT) with high conductivity is known as a substitute for ITO. Highly conductive PEDT such as that produced by Bayer ("in situ" PEDT with conductivity of 500 S/cm) has a very large voltage loss with large surface OLED elements when it is used as an ITO substitute (the conductivity of ITO is $10^4$ S/cm). As such, the brightness of the OLED elements degrades as the distance from voltage contacts increases.

WO 03/106571 A1 discloses increasing the conductivity of PEDT/PSS by replacing a solvent. PEDT/PSS is typically water-soluble and has a conductivity of up to $10^{-3}$ S/cm (H. C. Starck Baytron P TP A1 4083). Through the formulation of a soluble polymer, PEDT can have a conductivity of up to 130 S/cm (H. C. Starck Baytron F CPP 105D M) or 120 S/cm (Agfa Orgacon foil) or 500 S/cm (H. C. Starck polyster foil JOF 6073 coated with "in situ" PEDT).

By replacing water with an alcohol such as ethylene glycol, the conductivity of a PEDT/PSS solvent may be increased by a factor of two. According to WO 03/106571 A1, a PEDT/PSS solvent with a conductivity of up to $10^{-1}$ S/cm can be achieved. Thus, the conductivity of the PEDT/PSS solvent is not sufficiently increased with the replacement of ITO as an anode material for organic elements. It is also disadvantageous that the stability of a PEDT/PSS alcohol solvent is low. Due to agglomeration and coagulation that occurs after a predetermined amount of time, printability or homogenous processing during spin coating becomes difficult and the durability of the PEDT/PSS solvent diminishes.

SUMMARY OF THE INVENTION

The present invention provides a substrate for a durable light-emitting element that can be manufactured at low cost and includes an organic material that has high electric conductivity and a long lifespan. A standard PEDT solvent with a high conductivity may be used.

The present invention also provides a method for manufacturing the substrate, an electrode that includes the substrate, and a light-emitting element that includes the electrode.

Additional features of the invention will be set forth in the description which follows, and in part will be apparent from the description, or may be learned by practice of the invention.

The present invention discloses a substrate for a light-emitting element that includes a base substrate with a metal layer disposed on the base substrate and a conductive polymer layer disposed on the metal layer.

The present invention also discloses a method for manufacturing a substrate for a light-emitting element comprising coating a metal layer on a base substrate and coating a conductive polymer layer on the metal layer.

The present invention also discloses an electrode for a light-emitting element comprising a base substrate, a metal layer disposed on the base substrate, and a conductive polymer layer disposed on the metal layer.

The present invention also discloses a light-emitting element comprising a first electrode including a metal layer disposed on a base substrate and a conductive polymer layer disposed on the metal layer, a second electrode facing the first electrode, and a light-emitting layer interposed between the first electrode and the second electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
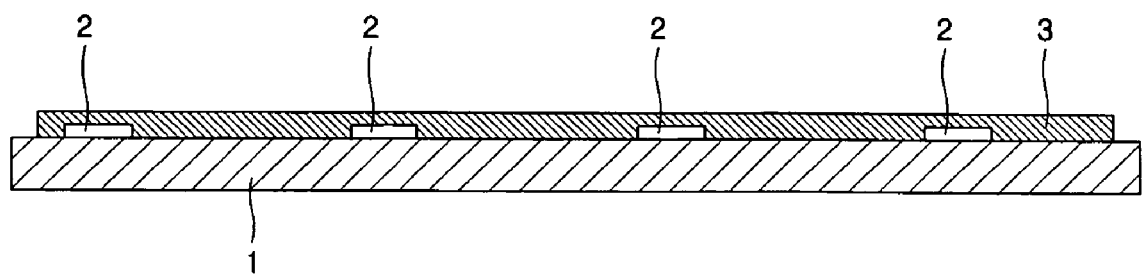
FIG. 1 is a schematic cross-sectional view of a substrate comprising a base substrate, a line-shaped metal layer, and a continuous polymer layer according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity.

It will be understood that when an element such as a layer, film, region or substrate is referred to as being "on" another element, it can be directly on the other element or intervening elements may also be present. In contrast, when an element is referred to as being "directly on" another element, there are no intervening elements present.

The present invention provides a substrate for a light-emitting element based on an organic light-emitting material that has high electrical conductivity, can be manufactured with low costs, is durable, and has a long lifespan.

FIG. 1 is a schematic cross-sectional view of a substrate comprising a base substrate 1, a line-shaped metal layer 2, and a continuous polymer layer 3 according to an exemplary embodiment of the present invention. A boron silicate glass is used as the base substrate 1. The base substrate 1 is cleaned in an ultrasonic isopropanol bath for 5 minutes, dried under nitrogen flow, and exposed to UV/ozone processing for 10 minutes.

Next, line-shaped metal layers 2 of about 100 mm width may be printed onto the base substrate 1 using a metal ink (Ex: Harima NPS-J LOT C 040218) by inkjet printing and tempered at 200° C. in an oven for 30 minutes. The metal layer 2 may be deposited by printing an ink that comprises a metal, including, but not limited to silver (Ag), copper (Cu), and gold (Au).

The metal layers 2 may be about 50 nm to about 150 nm wide and about 10 nm to about 200 nm high. The distance between adjacent metal layers 2 may be about 100 µm to about 1500 µm.

Next, a continuous polymer layer 3 such as highly conductive PEDT (Ex: Baytron® F CPP 105D M by Bayer AG) is deposited as a closed 80 nm thick layer by spin coating and then is dried on a heating plate at 180° C. for 10 minutes to form the substrate of FIG. 1. The continuous polymer layer 3 may be about 30 nm to about 300 nm thick.

Figure 2:
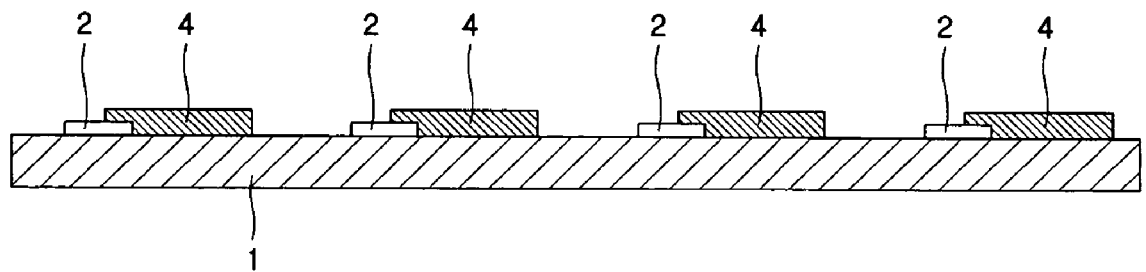
FIG. 2 is a schematic cross-sectional view of a substrate comprising a base substrate, a line-shaped metal layer, and a line-shaped polymer layer according to another exemplary embodiment of the present invention.
Figure 3:
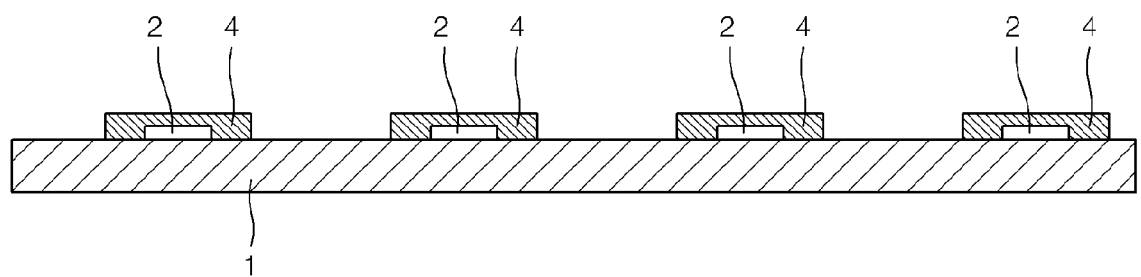
FIG. 3 is a schematic cross-sectional view of a modified example of the substrate shown in FIG. 2.

Alternatively, the polymer layer may also be arranged in a line shape. In this case, line-shaped polymer layers 4 may at least partially cover the metal layers 2 as shown in FIG. 2 or completely cover the metal layers 2 as shown in FIG. 3. The polymer layer 4 may be about 100 nm to about 400 nm wide and about 10 nm to about 200 nm high. The distance between the adjacent polymer layers may be about 100 µm to about 1500 µm. The line-shaped polymer layer 4 may be formed by photolithography or by ink-jet printing.

The polymer layers 3 and 4 may comprise, but are not limited to polyethylene dioxythiophene and polyaniline.

The polymer layers 4 are deposited by first printing the metal layers 2 onto the base substrate 1 and then drying them on a heating plate at 180° C. for 10 minutes. Then, the polymer layers 4 may be printed on the metal layers 2 to form the substrate shown in FIG. 2.

The substrate that has been described with reference to FIG. 1, FIG. 2, and FIG. 3 may be used as an electrode, such as an anode, in a light-emitting element. In addition, a light-emitting element that uses the substrate described above as a first electrode and includes a second electrode that faces the first electrode and a light-emitting layer interposed between the first electrode and the second electrode may be provided.

Figure 4:
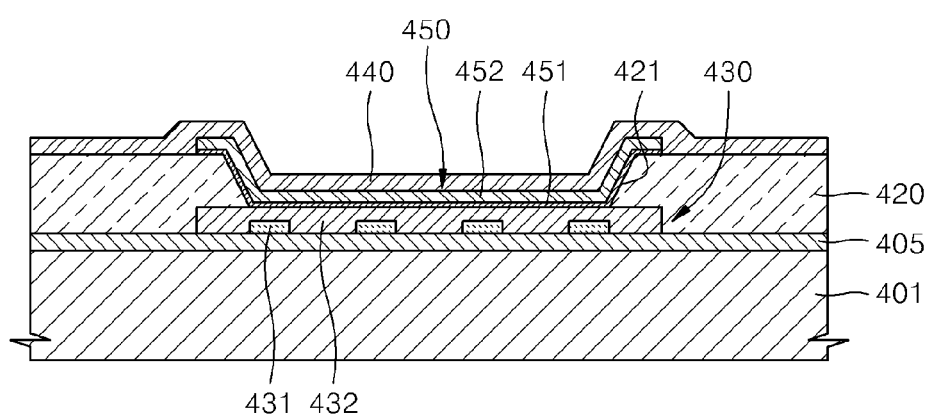
FIG. 4, FIG. 5, and FIG. 6 are cross-sectional views of a light-emitting element according to exemplary embodiments of the present invention.
Figure 5:
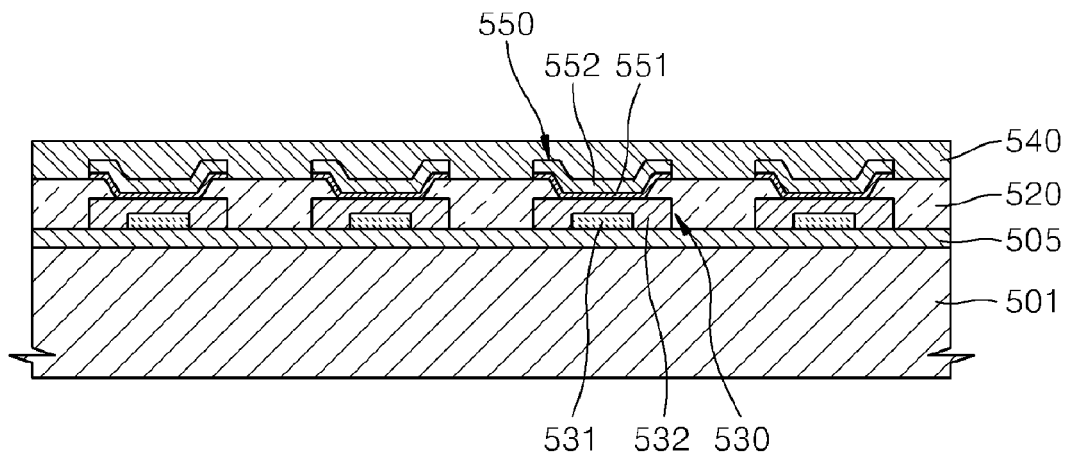
Figure 6:
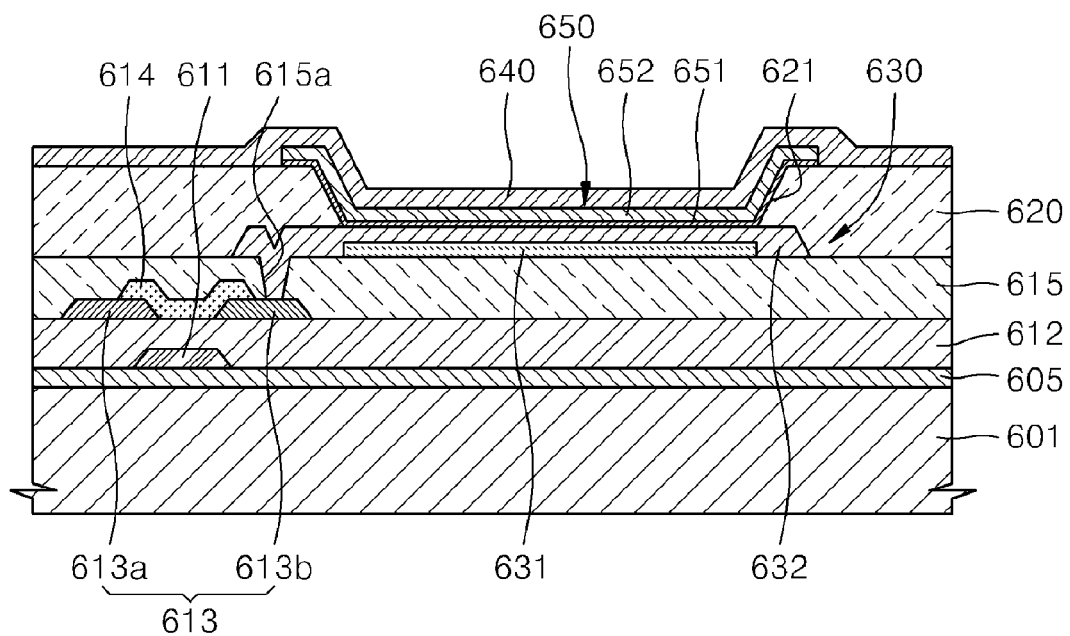

FIG. 4, FIG. 5, and FIG. 6 are cross-sectional views of a light-emitting element according to exemplary embodiments of the present invention.

As shown in FIG. 4, an organic electroluminescent element according to an exemplary embodiment of the present invention includes a first electrode 430 formed on a substrate 401, a second electrode 440 that faces the first electrode 430, and an organic layer 450 interposed between the first electrode 430 and the second electrode 440. Specifically, a buffer layer 405 may be formed on the substrate 401. The first electrode 430, the organic layer 450, and the second electrode 440 are sequentially formed on the buffer layer 405, and an interlevel dielectric (ILD) layer 420 is interposed as insulation between the first electrode 430 and the second electrode 440.

The substrate 401 may comprise boron silicate glass or plastics, for example. The buffer layer 405 may comprise $SiO_2$ and is used to prevent contamination on the substrate 401 or to prevent penetration of moisture or the air.

The first electrode 430 disposed on the buffer layer 405 may be formed in a line shape or patterned to correspond to a pixel with a predetermined shape, such as an icon. The first electrode 430 for a light-emitting element according to the present invention includes a metal layer 431 formed as a plurality of lines and a continuous polymer layer 432 that covers the metal layer 431. The line-shaped metal layer 431 and the continuous polymer layer 432 have the same configuration and arrangement as those of the metal layer 2 and the polymer layer 3 as described with reference to FIG. 1, FIG. 2, and FIG. 3. Thus, the first electrode 430 having the metal layer 431 and the polymer layer 432 may have an electric conductivity of up to 500 S/cm, no voltage drop, may be flexible, and have a highly durable lifespan.

The ILD layer 420 including an insulation material is formed to cover the first electrode 430 and an opening 421 is formed in the ILD layer 420 so that the first electrode 430 is exposed through the opening 421. The ILD layer 420 may be an organic insulating layer, an inorganic insulating layer or an organic-inorganic composite layer with a single or multilayered structure that is formed by inkjet printing. A solution that includes an insulation material for an ILD layer is sprayed onto the buffer layer 405 so that the first electrode 430 is surface-processed using fluorinated plasma to have hydrophobic properties, thereby forming the ILD layer 420. In this case, since the ILD layer 420 is not formed on the surface-processed first electrode 430, the opening 421 through which the first electrode 430 is exposed may be formed.

The organic layer 450 is formed to cover the first electrode 430 so that the organic layer 450 corresponds to the opening 421 of the ILD layer 420. The second electrode 440 that faces the first electrode 430 is formed on the organic layer 450. The second electrode 440 may be formed to cover all pixels of the light-emitting element, but is not limited thereto. If the first electrode 430 is patterned to correspond to a pixel with a predetermined shape, the second electrode 440 may also be patterned to correspond to the pattern.

In the above structure, the first electrode 430 and the second electrode 440 may both serve as either an anode or a cathode. The embodiment shown in FIG. 5 and FIG. 6 has the first electrode 430 as an anode and the second electrode 440 as a cathode.

When the organic electroluminescent element having the above structure is a front emission organic electroluminescent element, the first electrode 430 may be a reflection electrode, and the second electrode 440 may be a transparent electrode. When the organic electroluminescent element having the above structure is a rear emission organic electroluminescent element, the first electrode 430 may be a transparent electrode, and the second electrode 440 may be a reflection electrode. When the organic electroluminescent element having the above structure is a both-side emission organic electroluminescent element, both the first electrode 430 and the second electrodes 440 may be transparent electrodes.

The organic layer 450 may be a low molecular weight or a high molecular weight organic layer. When a low molecular weight organic layer is used as the organic layer 450, the low molecular weight layer is formed by stacking a hole injection layer (HIL), a hole transport layer (HTL) 451, a light-emitting layer (EML) 452, an electron transport layer (ETL), and an electron injection layer (EIL) in a single or composite structure. If the polarities of the first electrode 430 and the second electrode 440 are switched, that is, when the first electrode 430 is a cathode and the second electrode 440 is an anode, the organic layer 450 may be stacked and formed in the reverse of the above-described order.

A variety of organic materials such as copper phthalocyanine (CuPc), N,N'-Di(naphthalene-1-yl)-N,N'-diphenyl-benzidine (NPB), and tris-8-hydroxyquinoline aluminum (Alq3) may be used as the lower molecular weight organic layer. These low molecular weight organic layers are formed by vacuum deposition.

When a high molecular weight organic layer is used as the organic layer 450, it may include an HTL 451 and an EML 452. In this case, PEDOT may be used as the HTL 451 and high molecular organic materials such as poly-phenylenevinylene and polyfluorene may be used as the EML 452. These high molecular weight organic layers are formed by screen printing or ink-jet printing etc. After forming the organic electroluminescent element, the upper portion thereof is sealed.

FIG. 5 illustrates an organic electroluminescent element according to another exemplary embodiment of the present invention. The organic electroluminescent element of FIG. 5 has a similar structure to that of FIG. 4 except that a second electrode is formed on a flat surface and an ILD layer is formed in a line shape.

As shown in FIG. 5, a first electrode 530 is formed as in FIG. 3 in which the first electrode 530 is formed on a substrate 501 (buffer layer 505) and includes a metal layer 531 deposited in a line on the substrate 501 and a conductive polymer layer 532 that completely covers the metal layer 531.

Similar to the surface processing described in FIG. 4, an insulating layer or ILD 520 for insulating between the first electrode 530 and the second electrode 540 is formed. In contrast to the element described in FIG. 4, the insulating layer 520 of FIG. 5 is not formed on the first electrode 530 but may be formed in the space between the adjacent first electrodes 530 in a line shape according to a surface processing pattern formed on the first electrode 530. When surface processing is discontinuously performed along the first electrode 530, since the insulating layer 520 may be formed in a lattice shape, it may insulate between the first electrode 530 and second electrode 540 and define pixels.

An organic layer 550 is formed on the first electrode 530 in regions that are exposed by the insulating layer 520. The organic layer 550 is the same as the organic layer 450 of FIG. 4, and thus, a detailed description thereof will be omitted. The organic layer 550 includes an HTL 551 and an EML 552.

The second electrode 540 that faces the first electrode 530 may be formed to cover all of the organic layer 550 and the insulating layer 520, that is, over the entire surface of the organic electroluminescent element. When one of the first electrodes 530 and the organic layer 550 is formed in a predetermined pattern, the second electrode 540 may also be formed corresponding to the pattern.

In addition, the polymer layer 532 may completely cover the metal layer 531, thereby forming the first electrode 530. However, the polymer layer 532 may also partially cover the metal layer 531 as shown in FIG. 2, thereby forming the first electrode 530. In this case, the insulating layer 520 may be formed to cover a part of the metal layer 531 that is not covered by the polymer layer 532.

The organic electroluminescent element with the electrode for a light-emitting element as shown in FIG. 4 and FIG. 5 has been described as an example of a passive matrix (PM) type organic electroluminescent element. The organic electroluminescent element may also be an active matrix (AM) type organic electroluminescent element, and an embodiment thereof is shown in FIG. 6.

As shown in FIG. 6, a buffer layer 605 is formed on a substrate 601, and a gate electrode 611 is formed on the buffer layer 605. A gate insulating layer 612 is formed on the gate electrode 611 to insulate between a source/drain electrode 613 and the gate electrode 611. The source/drain electrode 613 is formed on the gate insulating layer 612, and a semiconductor layer 614 is formed on and contacts the source/drain electrode 613. The source/drain electrode 613 includes a source electrode 613a and a drain electrode 613b.

A planarization layer 615 having a contact hole that connects either 613a or 613b of the source/drain electrode 613 with a first electrode 630 is formed. The first electrode 630 may be the electrode for a light-emitting element shown in FIG. 1 and FIG. 3 and is formed on the planarization layer 615 to contact either 613a or 613b of the source/drain electrode 613. In addition, a pixel definition layer 620 that has an opening 621 and insulates between the first electrode 630 and the second electrode 640 is formed on the first electrode 630. An organic layer 650 is formed on the first electrode 630 through the opening 621 formed in the pixel definition layer 620, and a second electrode 640 that covers the organic layer 650 and the pixel definition layer 620 is formed.

The substrate 601 may be a glass substrate, a plastic substrate, or a metal substrate, but is not limited thereto. A buffer layer 605 that prevents impurities or ion penetration and diffusion is formed on the substrate 601 in the same way as buffer layer 405 or 505 shown in FIG. 4 or FIG. 5, respectively. The gate insulating layer 612 may be an organic insulating layer, an inorganic insulating layer, or an organic-inorganic composite layer with a single or multilayered structure. A semiconductor layer 614 that serves as a channel for coupling the source electrode 613a and the drain electrode 613b is formed over the source electrode 613a, the gate insulating layer 612, and the drain electrode 613b. The semiconductor layer 614 may comprise an inorganic semiconductor or an organic semiconductor.

Thus, the gate electrode 611, the gate insulating layer 612, the source/drain electrode 613, and the semiconductor layer 614 are combined to form a thin film transistor (TFT). The TFT having the above structure may be used as a driving TFT to drive pixels, and to determine the amount of current that flows through an organic electroluminescent element in response to a data signal that is transmitted from a switching TFT (not shown).

In order to couple the first electrode 630 with the driving TFT, a planarization layer 615 that covers the source/drain electrode 613, the semiconductor layer 614, and the gate insulating layer 612 are formed. The planarization layer 615 is a base for forming the first electrode 630 and insulates the source/drain electrode 613 and the first electrode 630 from each other. The planarization layer 615 includes a contact hole 615a through which the first electrode 630 contacts one of the source electrode 613a and the drain electrode 613b. The planarization layer 615 may be an organic insulating layer, an inorganic insulating layer, or an organic-inorganic composite layer with a single or stack structure, like the gate insulating layer 612.

The first electrode 630 is disposed on the planarization layer 615. The first electrode 630 is an anode for a light-emitting element and includes a metal layer or metal line 631 disposed on the planarization layer 615 and a conductive polymer layer or polymer line 632 that completely covers the metal layer or the metal line 631. The metal layer or the metal line 631 and the polymer layer or the polymer line 632 correspond to the metal layer or the metal line 2 and the polymer layer or the polymer line 3, respectively, shown in FIG. 1, FIG. 2, and FIG. 3. In addition, the polymer layer or the polymer line 632 contacts one of the source electrode 613a and the drain electrode 613b through the contact hole 615a that perforates the planarization layer 615. The first electrode 630 is similar to the first electrode 430 shown in FIG. 4.

A pixel definition layer 620 including an insulation material is formed to cover the first electrode 630, and an opening 621 is formed in the pixel definition layer 620 so that the first electrode 630 is exposed through the opening 621. The pixel definition layer 620 may be an organic insulating layer, an inorganic insulating layer or an organic-inorganic composite layer in a single or multilayered structure that is formed by inkjet printing. The pixel definition layer 620 is formed in the same way as the ILD layer 420 of FIG. 4, and thus, a detailed description thereof will be omitted.

The organic layer 650 is formed to cover the first electrode 630 corresponding to the opening 621 of the pixel definition layer 620. The second electrode 640 is formed on the organic layer 650 to face the first electrode 630. The organic layer 650 may be formed in the same way as the organic layer 450, 550 shown in FIG. 4 or FIG. 5. The organic layer 650 includes an HTL 651 and an EML 652. The second electrode 640 may be formed to cover the entire pixel of the light-emitting element, but is not limited to this. When the first electrode 630 is patterned to correspond to a pixel with a predetermined shape, the second electrode 640 may also be patterned to correspond to the pattern.

The organic electroluminescent element of the present invention has been described in several embodiments. However, the present invention may be applied to a light-emitting element with a different shape such as a liquid crystal display element or a field emission display element.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light-emitting element, comprising:
    an anode including a metal layer and a conductive polymer layer disposed on the metal layer;
    a cathode facing the anode; and
    an organic layer including a hole transport layer and a light-emitting layer, the organic layer being interposed between the anode and the cathode,
    wherein the conductive polymer layer contacts at least a first surface and a second surface of the metal layer, and
    wherein the first surface and the second surface are not coplanar surfaces, and
    wherein the metal layer is arranged between the conductive polymer layer and a buffer layer formed on a substrate.

2. The light-emitting element of claim 1,
    wherein the metal layer comprises a metal selected from the group consisting of silver (Ag), copper (Cu), and gold (Au).

3. The light-emitting element of claim 1,
    wherein the metal layer is formed in a line shape.

4. The light-emitting element of claim 3,
    wherein the metal layer is about 50 nm to about 150 nm wide and about 10 nm to about 200 nm high, and
    wherein a distance between adjacent metal layers is about 100 μm to about 1500 μm.

5. The light-emitting element of claim 1,
    wherein the conductive polymer layer comprises a polymer selected from the group consisting of polyethylene dioxythiophene and polyaniline.

6. The light-emitting element of claim 1,
    wherein the conductive polymer layer is formed of a continuous layer that is about 30 nm to about 300 nm thick.

7. The light-emitting element of claim 1,
    wherein conductive polymer layer is formed in a line shape.

8. The light-emitting element of claim 7,
    wherein the polymer layer is about 100 nm to about 400 nm wide and about 10 nm to about 200 nm high, and
    wherein a distance between adjacent polymer layers is about 100 μm to about 1500 μm.

9. The light-emitting element of claim 7,
    wherein the polymer layer partially covers the metal layer.

10. The light-emitting element of claim 7,
    wherein the polymer layer completely covers the metal layer.

11. The light-emitting element of claim 1, further comprising:
    a thin film transistor comprising a source electrode and a drain electrode; and
    an insulating layer disposed on the thin film transistor,
    wherein the anode is coupled to either the source electrode or the drain electrode via a contact hole in the insulating layer.

12. The light-emitting element of claim 11, wherein the conductive polymer layer contacts the insulating layer and either the source electrode or the drain electrode.

* * * * *